US008794777B2

(12) United States Patent
Ito et al.

(10) Patent No.: US 8,794,777 B2
(45) Date of Patent: Aug. 5, 2014

(54) LIGHT EMITTING DEVICE, SURFACE ILLUMINANT, AND DISPLAY DEVICE

(75) Inventors: Shin Ito, Osaka (JP); Yutaka Okada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 271 days.

(21) Appl. No.: 13/127,863

(22) PCT Filed: Nov. 10, 2009

(86) PCT No.: PCT/JP2009/069118
§ 371 (c)(1),
(2), (4) Date: May 5, 2011

(87) PCT Pub. No.: WO2010/053193
PCT Pub. Date: May 14, 2010

(65) Prior Publication Data
US 2011/0211337 A1    Sep. 1, 2011

(30) Foreign Application Priority Data

Nov. 10, 2008    (JP) .................................. 2008-287966

(51) Int. Cl.
*F21V 5/04*    (2006.01)
(52) U.S. Cl.
USPC ................ 362/97.1; 362/311.02; 362/311.09; 362/311.1; 362/311.06; 362/97.2
(58) Field of Classification Search
USPC ................... 362/97.1, 311.02, 311.09, 311.1, 362/311.06, 97.2
See application file for complete search history.

(56) References Cited

U.S. PATENT DOCUMENTS

| 4,602,850 | A | * | 7/1986 | DeBenedetti | .................... 349/41 |
| 4,822,142 | A | * | 4/1989 | Yasui | ............................... 349/48 |
| 5,893,633 | A |   | 4/1999 | Uchio et al. | |
| 6,953,271 | B2 | * | 10/2005 | Aynie et al. | .................... 362/511 |
| 7,385,653 | B2 | * | 6/2008 | Kim et al. | ......................... 349/61 |
| 7,554,742 | B2 | * | 6/2009 | Chinniah et al. | ............... 359/641 |
| 8,021,008 | B2 | * | 9/2011 | Ramer | ............................. 362/84 |
| 2004/0170018 | A1 |   | 9/2004 | Nawashiro | |
| 2007/0159832 | A1 |   | 7/2007 | Kim et al. | |

(Continued)

FOREIGN PATENT DOCUMENTS

| JP | 9-162446 A | 6/1997 |
| JP | 2004-165352 | 6/2004 |
| JP | 2004-265727 A | 9/2004 |
| JP | 2005-353875 | 12/2005 |
| JP | 2007-188858 | 7/2007 |
| JP | 2007-227530 | 9/2007 |

(Continued)

OTHER PUBLICATIONS

International Search Report for PCT/JP2009/069118, mailed Dec. 8, 2009.

*Primary Examiner* — Sharon Payne
(74) *Attorney, Agent, or Firm* — Nixon & Vanderhye PC

(57) ABSTRACT

A light emitting device includes: a substrate; a semiconductor light emitting element provided on the substrate; a sealing member which covers the semiconductor light emitting element; and a lens having a plurality of convex parts and a concave part. The light emitting device emits light having a non-concentric luminance distribution made up of a plurality of bright regions and a plurality of dark regions, the non-concentric luminance distribution being observed on a plane which is parallel to the substrate. This makes it possible to provide (i) a display device which has a thin body and hardly causes unevenness in luminance and in chromaticity, and (ii) a light emitting device and (iii) a surface illuminant suitable, which are suitable for use in the display device.

11 Claims, 11 Drawing Sheets

(56) References Cited

U.S. PATENT DOCUMENTS

2008/0002412 A1 1/2008 Tanaka et al.
2008/0031009 A1 2/2008 Kodaira et al.
2010/0027242 A1 2/2010 Kishine et al.

FOREIGN PATENT DOCUMENTS

| JP | 2008-010693 | 1/2008 |
| JP | 2008-112591 | 5/2008 |
| JP | 2008-250174 | 10/2008 |

* cited by examiner

FIG. 8
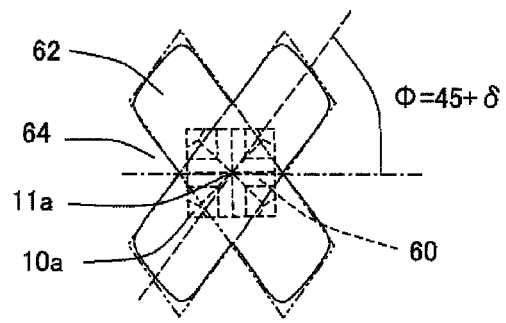
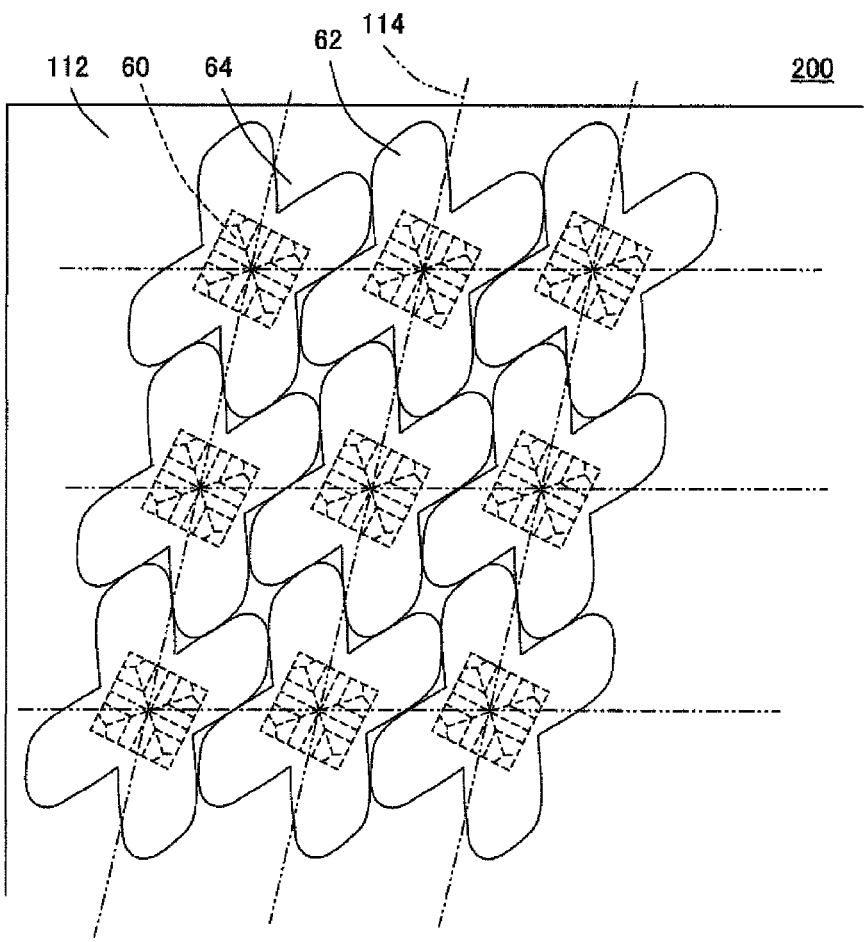

FIG. 9
(a)
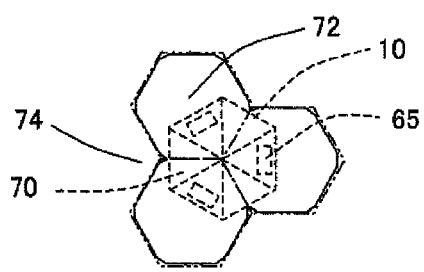
(b)
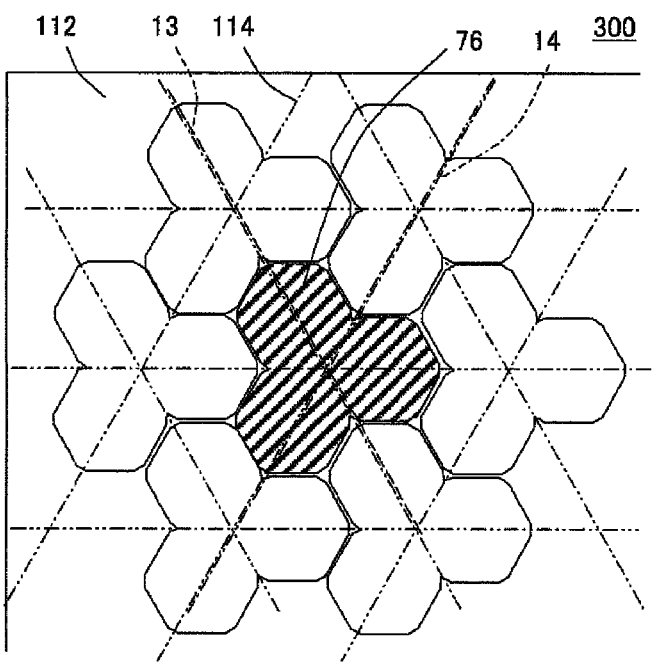

LIGHT EMITTING DEVICE, SURFACE ILLUMINANT, AND DISPLAY DEVICE

This application is the U.S. national phase of International Application No. PCT/JP2009/069118, filed 10 Nov. 2009, which designated the U.S. and claims priority to Japan Application No. 2008-287966, filed 10 Nov. 2008, the entire contents of each of which are hereby incorporated by reference.

TECHNICAL FIELD

The present invention relates to (i) a light emitting device including a sealing member which causes emitted light to be directed toward a predetermined direction, (ii) a surface illuminant including the plurality of light emitting devices, and (iii) a display device including the surface illuminant.

BACKGROUND ART

There is a liquid crystal display device which includes, as a backlight which irradiates a liquid crystal display panel with light from behind, a surface illuminant in which light sources such as LEDs (light emitting diodes) are provided. Such a backlight, which irradiates a liquid crystal display panel with light from behind, is called a direct type backlight.

Patent Literature 1 discloses a direct type backlight in which a plurality of LEDs are provided so as not to be in contact with each other. The respective plurality of LEDs emit light rays which are mixed to be uniform white light. The backlight includes (i) a base substrate, (ii) LEDs which are provided on the base substrate and emit blue light, red light, and green light, respectively, (iii) a diffusion plate which is provided above the LEDs, and (iv) lenses which are provided for the respective LEDs so as to cause emitted light to be directed toward the diffusion plate. Moreover, radiation angles of the respective lenses are adjusted so that the light rays emitted by the respective LEDs are mixed in a common area of the diffusion plate.

CITATION LIST

Patent Literature

Patent Literature 1

Japanese Patent Application Publication, Tokukai, No. 2007-188858 (Publication Date: Jul. 26, 2007)

SUMMARY OF INVENTION

Technical Problem

Note, however, that, according to the backlight disclosed in Patent Literature 1, optic axes of the respective LEDs are directed in different directions, because of the configuration in which (i) the LEDs are provided so as not to be in contact with each other, (ii) the lenses are provided so as to cause the emitted light rays to be directed in a predetermined direction, and (iii) the common area of the diffusion plate is irradiated by the light rays. This may cause a phenomenon that colors, which are seen via the diffusion plate, are changed depending on an angle, because a spectral distribution changes depending on an emission direction.

Moreover, the number of components is increased in accordance with the number of the lenses. Besides, it is necessary to adjust chromaticity after the lenses are provided. This leads to an increase in manufacturing cost. Moreover, this interferes with meeting demands of reduction in thickness and weight of backlight.

The present invention is accomplished in view of the problem, and its object is to provide (i) a display device which has a thin body and hardly causes unevenness in luminance and in chromaticity, and (ii) a light emitting device and (iii) a surface illuminant, which are suitable for use in the display device.

Solution to Problem

A light emitting device of the present invention includes: a substrate; a semiconductor light emitting element provided on the substrate; a sealing member which is provided so as to cover the semiconductor light emitting element; and a lens made up of a plurality of convex parts and a concave part, the light emitting device emitting light having a non-concentric luminance distribution made up of a plurality of bright regions and a plurality of dark regions, the non-concentric luminance distribution being observed on a plane which is parallel to the substrate.

Advantageous Effects of Invention

According to the present invention, it is possible to provide a display device, which has a thin body but can suppress unevenness in luminance and in chromaticity, by combining the light emitting devices each of which has a non-concentric luminance distribution made up of the plurality of bright regions and the plurality of dark regions. Moreover, it is possible to provide the surface illuminant and the light emitting device each of which has a characteristic shape suitable for use in the display device.

BRIEF DESCRIPTION OF DRAWINGS

FIG. 8 is a view illustrating (i) an irradiation shape of the four-leaf-shaped light emitting device, and (ii) an arrangement pattern of the four-leaf-shaped light emitting devices, in accordance with the surface illuminant of Embodiment 2.

FIG. 9 is a view illustrating (i) 3-fold rotational symmetric irradiation shape of the surface illuminant, and (ii) an arrangement pattern of the surface illuminants, in accordance with Embodiment 3.

3

Figure 10:
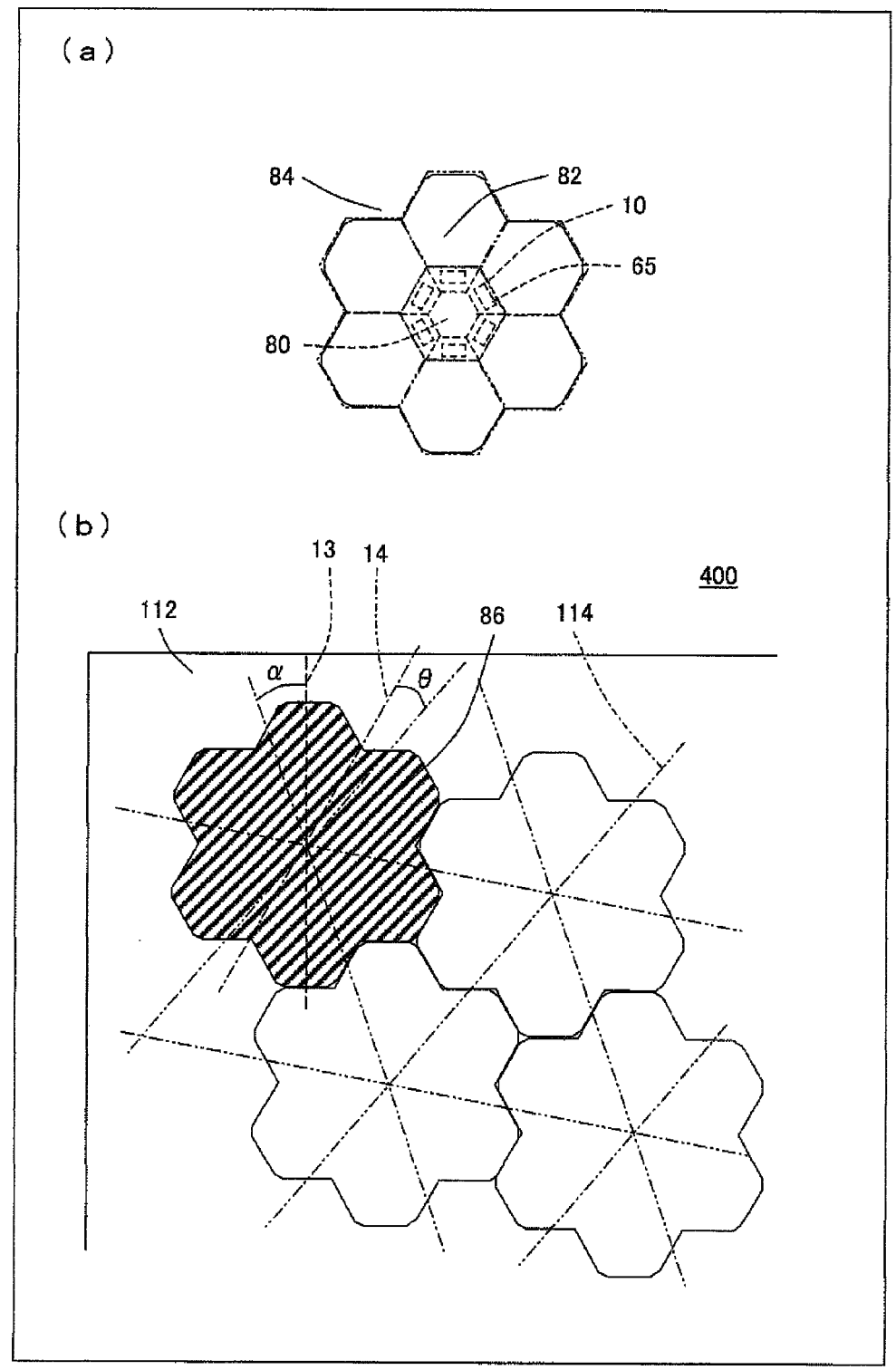

FIG. 10 is a view illustrating (i) 6-fold rotational symmetric irradiation shape of the surface illuminant, and (ii) an arrangement pattern of the surface illuminants, in accordance with Embodiment 3.

Figure 11:
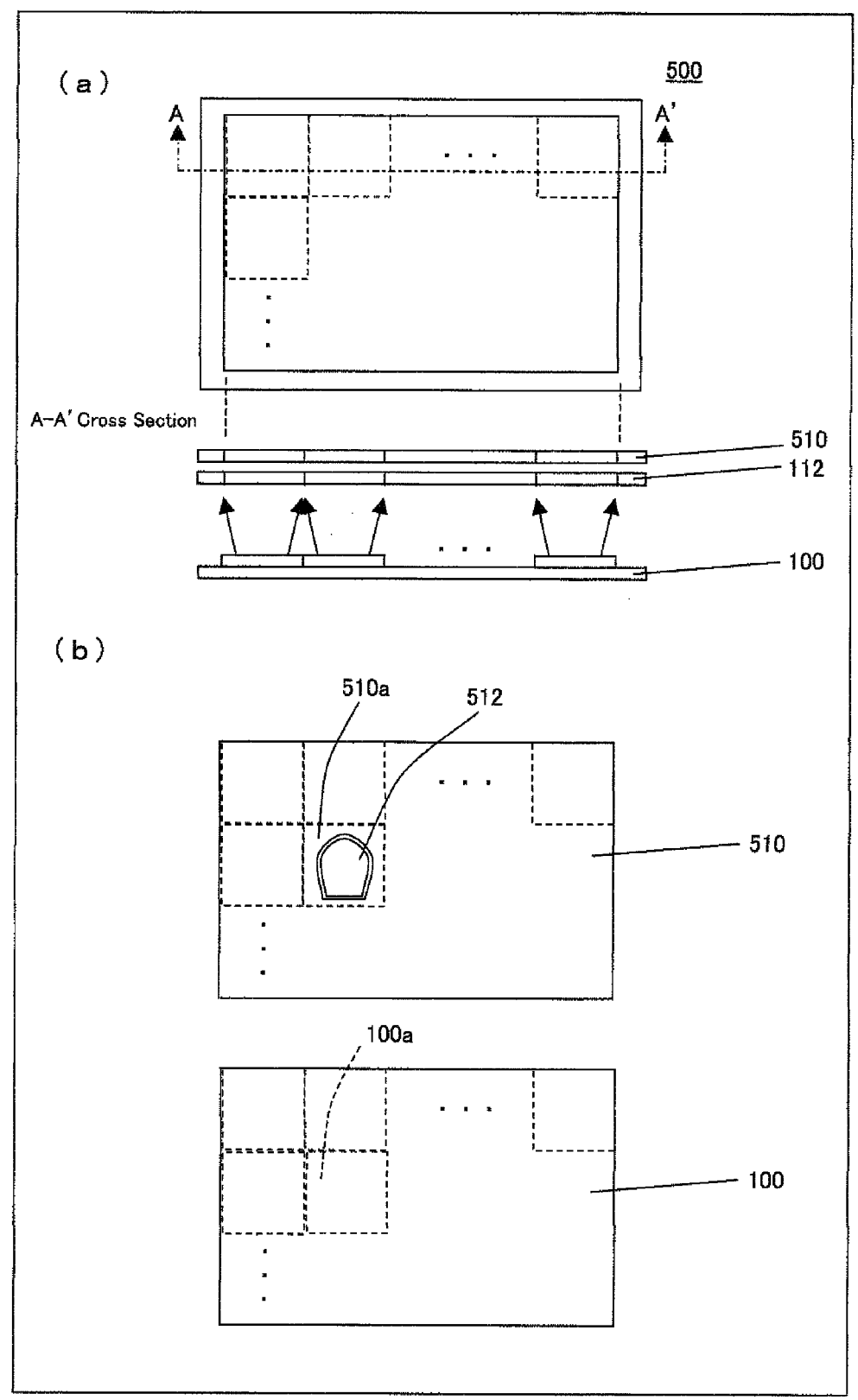

FIG. 11 is a schematic view illustrating a local dimming liquid crystal display device.

DESCRIPTION OF EMBODIMENTS

Embodiment 1

Light Emitting Device

The following describes a light emitting device of the present invention with reference to drawings.

Figure 1:
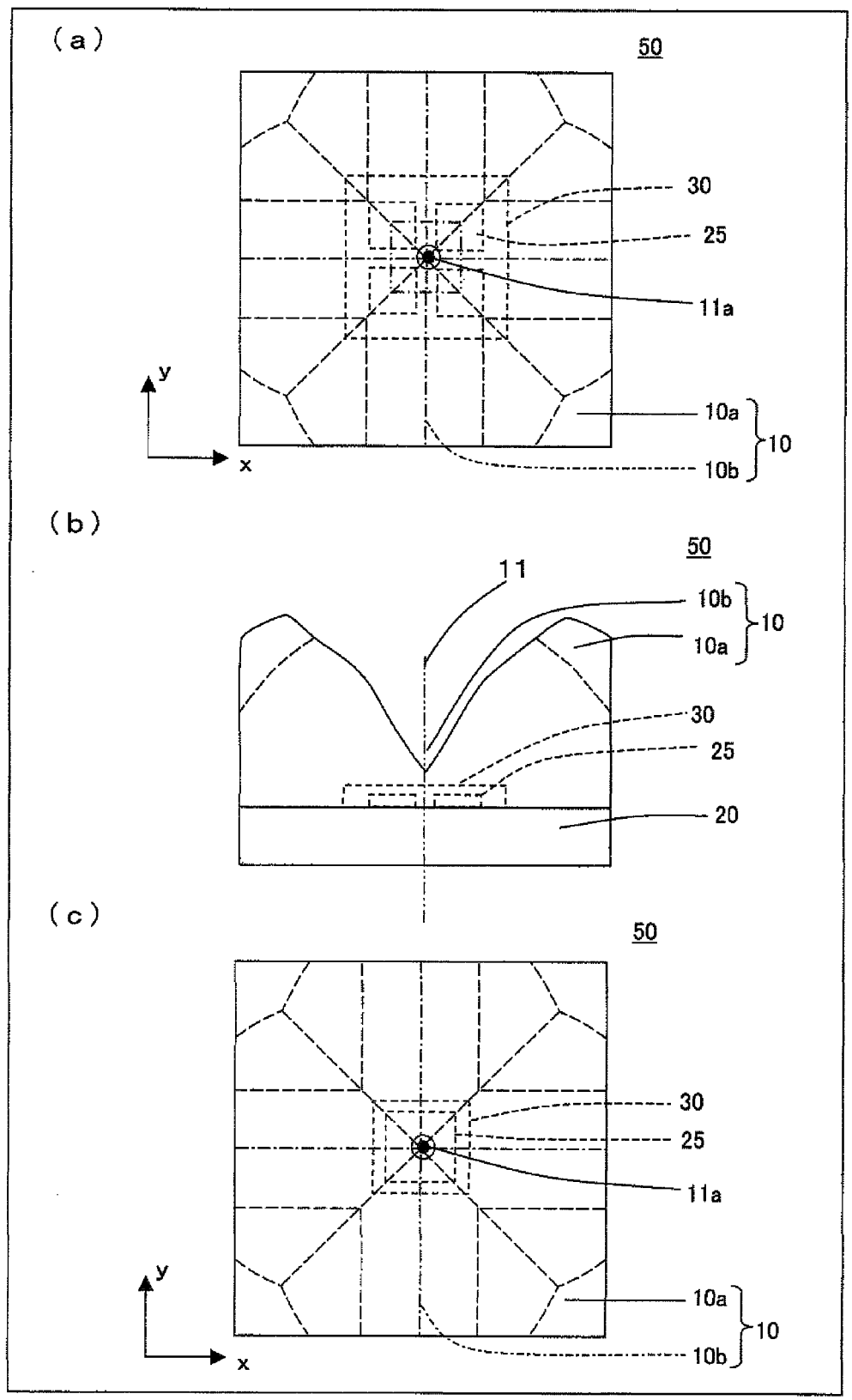
FIG. 1 is a plane view and a lateral view illustrating a four-leaf-shaped light emitting device of Embodiment 1.

FIG. 1 shows plane views and a lateral view illustrating a four-leaf-shaped light emitting device of Embodiment 1. A four-leaf-shaped light emitting device 50 has a characteristic outer shape defined by a lens 10 which serves also as a sealing member. Specifically, the lens 10 is made up of (i) four convex parts 10a, which are provided, when viewed from above, on respective opposing corners of the lens 10 so as to be protuberant and (ii) a canaliform concave part 10b, which extends between respective any adjacent two of the convex parts 10a. The four convex parts 10a and the concave part 10b are arranged so as to have, as a whole, a four-leaved shape, which is a 4-fold rotational symmetric shape around a major axis 11. Note that, in FIG. 1, the convexes are indicated by dashed lines and the concaves are indicated by dashed-dotted lines. The major axis 11 of the present embodiment is a rotational symmetric axis of the shape of the lens 10 which rotational symmetric axis coincides with rotational symmetric axes of an arrangement and an irradiation shape of each semiconductor light emitting element (hereinafter, referred to as LED chip) 25 (later described).

The following describes a configuration of the four-leaf-shaped light emitting device 50. The four-leaf-shaped light emitting device 50 includes a substrate 20, an LED chip 25 which is provided on the substrate 20, a wavelength converter 30 which covers the LED chip 25, and a lens 10 which serves also as a sealing member and covers the wavelength converter 30. The substrate 20 is made of a material such as ceramic, resin, or metal. On a surface of the substrate 20, an electrode (not illustrated) for supplying electric power to the LED chip 25 is provided. The LED chip 25 is a nitride semiconductor light emitting element which emits primary light (blue light) whose emission peak wavelength falls within, for example, a range between 400 nm to 500 nm (i.e., blue wavelength area).

The LED chip 25 is provided on the substrate 20 via a material such as a waxy material or an adhesive agent. Further, an electrode of the LED chip 25 and the electrode provided on the substrate 20 are electrically connected with each other by wire bonding (not illustrated). Then, the LED chip 25 is covered with a resin, in which fluorescent substances are dispersed in advance, so that the wavelength converter 30 is formed. Each of the fluorescent substances absorbs the primary light and then emits secondary light (yellow light) whose emission peak wavelength falls within, for example, a range between 550 nm to 600 nm (i.e., yellow wavelength area). The light emitting device 50 is configured so as to emit white light which is a mixture of the primary light and the secondary light.

Note that a material, such as BOSE (Ba, O, Sr, Si, Eu), SOSE (Sr, Ba, Si, O, Eu), YAG (Ce-activated yttrium aluminum garnet), α-sialon ((Ca), Si, Al, O, N, Eu), or β-sialon (Si, Al, O, N, Eu), can be used as the fluorescent substance. Moreover, it is possible to further improve luminous efficiency by using, as the LED chip 25, an ultraviolet (near-ultraviolet) LED chip, whose emission peak wavelength falls within, for example, a range between 390 nm to 420 nm, instead of the semiconductor light emitting element which emits blue light.

Then, the wavelength converter 30 is covered with the lens 10. The lens 10 is made of a material, such as epoxy resin or silicone resin, which can (i) cause light emitted from the wavelength converter 30 to transmit and (ii) serve as a prism for causing the light emitted from the wavelength converter 30 to be directed toward a predetermined direction.

According to the present embodiment, a total of four LED chips 25 are provided, around the major axis 11 serving as the center, at respective four apexes of an imaginary square indicated by a dashed-two dotted line on the substrate 20 (see (a) of FIG. 1). Further, each of the LED chips 25 is sealed so as to be contained in a molded product which has a substantially square pyramid shape whose apex serves as a corresponding one of the convex parts 10a of the lens 10. Moreover, the concave part 10b is provided above an area between corresponding two adjacent ones of the LED chips 25 (see (b) of FIG. 1). According to the configuration, light emitted from each of the LED chips 25 is directed by a corresponding one of the molded products covering the each of the LED chips 25. Therefore, even in a case where the LED chips 25 are slightly displaced with respect to an x-direction and/or a y-direction, the four-leaf-shaped light emitting device 50 can secure a highly symmetric light distribution characteristic.

Note that the present embodiment can also be exemplified by a configuration in which a single LED chip 25 can be alternatively provided at an intersection of the substrate 20 and the major axis 11 (see (c) of FIG. 1). In such a configuration, it is important that (i) the center of the LED chip 25 coincides with the major axis 11 and (ii) light emitted from such a single LED chip 25 is evenly distributed to the four molded products.

Figure 2:
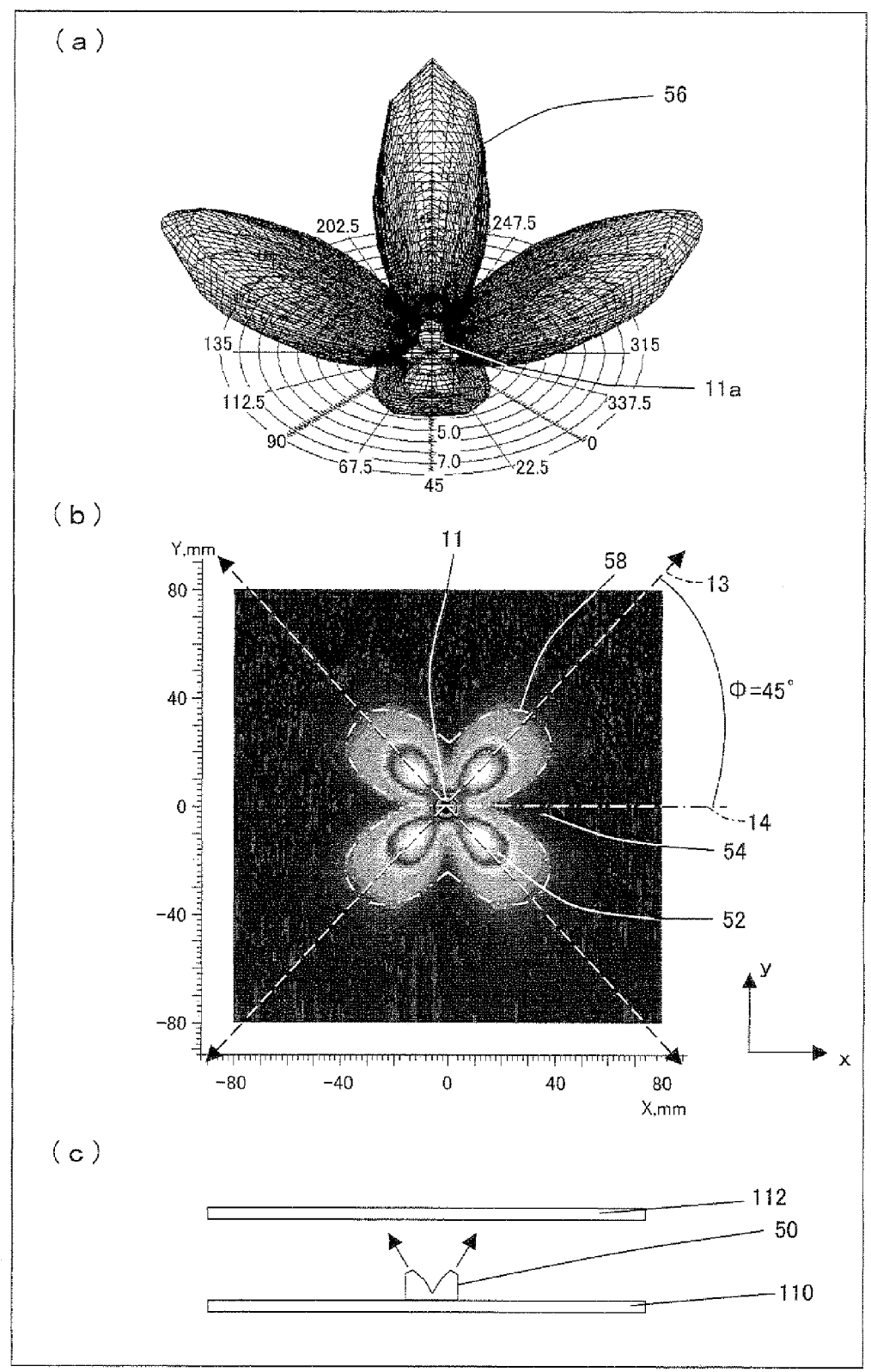
FIG. 2 is a view illustrating (i) a light distribution characteristic of, (ii) an irradiation shape of, and (iii) a method for evaluating an irradiation shape of the four-leaf-shaped light emitting device in accordance with Embodiment 1.

FIG. 2 illustrates (i) a light distribution characteristic of, (ii) an irradiation shape of, and (iii) a method for evaluating the irradiation shape of the four-leaf-shaped light emitting device in accordance with Embodiment 1. (a) of FIG. 2 is a simulation diagram which three-dimensionally illustrates the light distribution characteristic, where an intensity of emitted light is indicated by a distance from a center 11a to an outer enclosing surface 56.

(b) of FIG. 2 is a simulation diagram illustrating an irradiation shape of the four-leaf-shaped light emitting device 50. The irradiation shape means, as later described, a luminance distribution observed when a diffusion plate 112 is irradiated with light. In (b) of FIG. 2, (i) the irradiation shape is indicated by a dashed-two dotted contour line 58, (ii) bright regions, each of which is surrounded by the dashed-two dotted contour line 58 and has high luminance, are indicated by reference numeral 52, and (iii) dark regions, each of which is in the vicinity of a corresponding one of the bright regions 52 and has a low luminance, is indicated by reference numeral 54. According to the irradiation shape of the four-leaf-shaped light emitting device 50, the four non-concentric bright regions 52 are generated above the respective convex parts 10a and the four dark regions 54 are generated above the concave part 10b.

The LED chips 25, each of which has a square shape when viewed from above, are provided at the respective four apexes of the imaginary square indicated by the dashed-two dotted line on the substrate 20 (see (a) of FIG. 1). Accordingly, the irradiation shape of the four-leaf-shaped light emitting device 50 becomes an X-shaped 4-fold rotational symmetry, which is non-concentric with respect to the center 11a, as with the shape of the lens 10. If (i) a line connecting each of the bright regions 52 with the center 11a is defined as a bright region axis 13 and (ii) a line connecting each of the dark regions 54 with the center 11a is defined as a dark region axis 14, then the bright region axis 13 and the dark region axis 14 is at an angle of ø (ø=45°). Moreover, the dark region axes 14 coincide with a line along the concave part 10b, whereas are in parallel with an x-axis or a y-axis.

(c) of FIG. 2 illustrates a method for evaluating the irradiation shape of the four-leaf-shaped light emitting device 50. The four-leaf-shaped light emitting device 50 is provided on a base substrate 110. Moreover, a diffusion plate 112 is provided so as to face the base substrate 110. The luminance distribution can be observed on a front surface of the diffusion plate 112, by backlighting the diffusion plate 112 with the use of the four-leaf-shaped light emitting device 50.

The irradiation shape indicates what is observed via the diffusion plate 112. On the other hand, the simulation diagram illustrating the irradiation shape indicates what is obtained by simulating a luminance distribution on an observation surface right in front of an entrance surface of the diffusion plate 112, but can be equated with what is observed via the diffusion plate 112.

Figure 3:
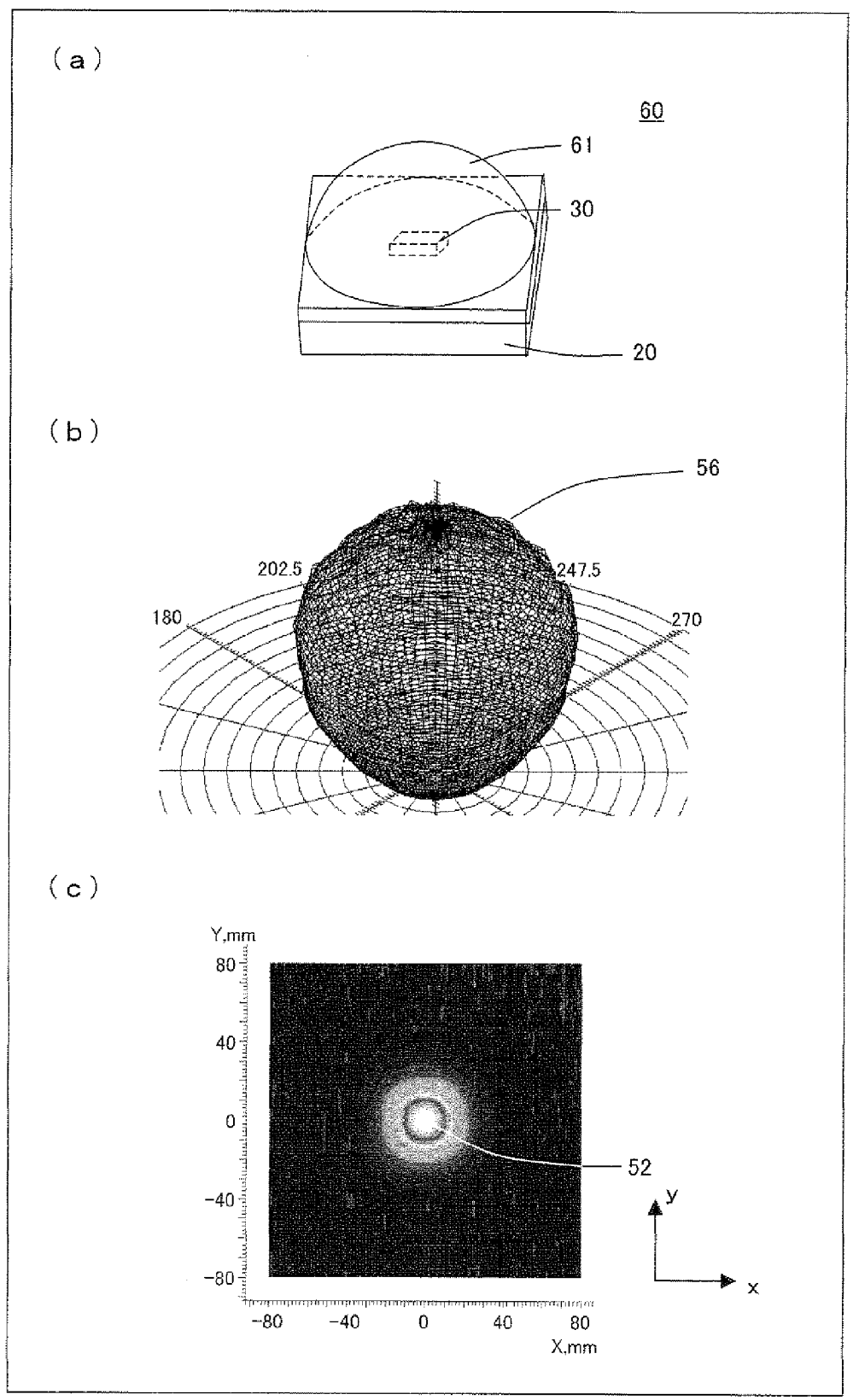
FIG. 3 is a view illustrating (i) a shape of, (ii) a light distribution characteristic of, and (iii) an irradiation shape of a dome-shaped light emitting device.

Note that FIG. 3 illustrates, for comparison, a shape of, a light distribution characteristic of, and an irradiation shape of a dome-shaped light emitting device. A dome-shaped light emitting device 60 includes (i) a substrate 20, (ii) an LED chip 25 (not illustrated) provided on the substrate 20, (iii) a wavelength converter 30 which covers the LED chip 25, and (iv) a sealing member 61 which has a dome shape and covers the wavelength converter 30.

(b) of FIG. 3 is a simulation diagram three-dimensionally illustrating a light distribution characteristic of the dome-shaped light emitting device 60, which is a comparative example. (c) of FIG. 3 is a simulation diagram illustrating an irradiation shape of the dome-shaped light emitting device 60. According to (b) and (c) of FIG. 3, (i) the light distribution characteristic of the dome-shaped light emitting device 60 is shown as a spherical shape in the three-dimensional simulation diagram and (ii) the irradiation shape becomes concentric with a bright region 52 occurring above the LED chip 25.

From comparison between the irradiation shape of the four-leaf-shaped light emitting device 50 and that of the dome-shaped light emitting device 60, it is clear that an irradiation range per light emitting device is larger in the four-leaf-shaped light emitting device 50 than in the dome-shaped light emitting device 60.

Note that, according to the four-leaf-shaped light emitting device 50, the lens 10 (four-leaf-shaped lens), which serves also as a sealing member, seals the LED chips 25 and the wavelength converter 30. However, the present embodiment can also be exemplified by a configuration in which a four-leaf-shaped lens is separated from a sealing member, that is, a four-leaf-shaped lens is provided on a general sealing member covering an LED chip. In such a configuration, a space or another sealing member such as transparent resin can be provided between the sealing member and the four-leaf-shaped lens.

(Surface Illuminant)

Figure 4:
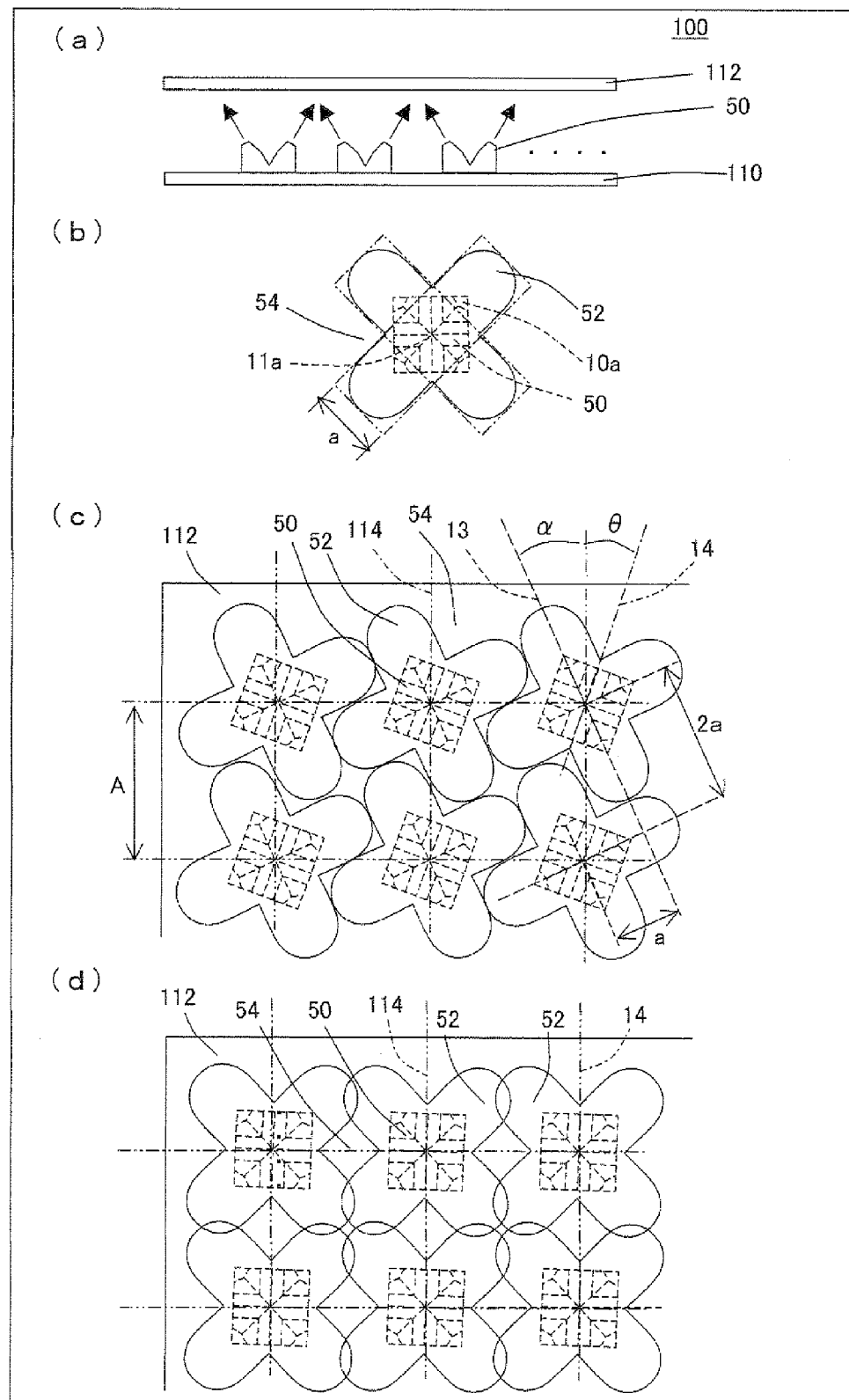
FIG. 4 is a view illustrating (i) a schematic configuration of a surface illuminant, (ii) an irradiation shape of the four-leaf-shaped light emitting device, and (iii) an arrangement pattern of the four-leaf-shaped light emitting devices, in accordance with Embodiment 1.

FIG. 4 shows (i) a schematic configuration of a surface illuminant, (ii) an irradiation shape of a four-leaf-shaped light emitting device, and (iii) arrangement patterns of the four-leaf-shaped light emitting devices, in accordance with Embodiment 1. (a) of FIG. 4 is a lateral view of a surface illuminant 100. As is clear from (a) of FIG. 4, the surface illuminant 100 includes (i) a base substrate 110, (ii) a plurality of light emitting devices 50 provided on the base substrate 110, and (iii) a diffusion plate 112 provided so as to face the base substrate 110. The plurality of light emitting devices 50 are arranged so that (i) a backside of the diffusion plate 112 is irradiated with light emitted from the plurality of light emitting devices 50, (ii) the light is diffused by the diffusion plate 112, and then (iii) surface light is emitted from a front surface of the diffusion plate 112.

(b) of FIG. 4 is a schematic view illustrating how a four-leaf-shaped light emitting device 50 corresponds to its irradiation shape. Each of the plurality of the four-leaf-shaped light emitting devices 50 includes a lens 10, which (i) serves also as a sealing member and (ii) is made up of four convex parts 10a, which are provided, when viewed from above, on respective opposing corners of the lens 10 so as to be protuberant. The irradiation shape observed via the diffusion plate 112 is made up of four bright regions 52 which are generated above the respective convex parts 10a. Further, four dark regions 54, which are relatively darker than the bright regions 52, are generated in the vicinity of corresponding ones of the bright regions 52.

The following description is dealt with, on the premise that (i) the irradiation shape has an X-shape in which five identical squares (indicated by dashed-two dotted lines in (b) of FIG. 4), each having a side with a length of "a", are arranged, (ii) each of the bright regions 52 has a shape so as to be contained in a corresponding one of the squares, and (iii) the bright regions 52 have substantially identical luminances.

(c) of FIG. 4 is a plane view illustrating (i) an arrangement of the plurality of four-leaf-shaped light emitting devices 50 and (ii) irradiation shapes of the respective plurality of four-leaf-shaped light emitting devices 50 serving as a surface illuminant. As is clear from the configuration shown in (c) of FIG. 4, the plurality of four-leaf-shaped light emitting devices 50, each of which emits light with the irradiation shape shown in (b) of FIG. 4, are provided on the base substrate 110 in a square manner. Specifically, assuming that lattice points of alignment axes 114 serve as apexes of squares, the plurality of four-leaf-shaped light emitting devices 50 are (i) provided so as to be located on the respective lattice points (see dashed-two dotted lines in (c) of FIG. 4), and (ii) rotated by an angle θ with respect to the alignment axes 114.

Note that, on the base substrate 110, the alignment axes 114 indicate first lines each connecting centers 11a of four-leaf-shaped light emitting devices 50 which are arranged in a corresponding column and second lines each connecting centers 11a of four-leaf-shaped light emitting devices 50 which are arranged in a corresponding row. Moreover, the rotational angle θ is defined by an angle at which the dark region axis 14 is to the alignment axis.

In a case where the irradiation shape has the shape shown in (b) of FIG. 4, the rotational angle meets θ=18.4°. The 18.4° is found, by taking into consideration drawn dotted additional lines (see (c) of FIG. 4), based on the following relational expression: α=arctan(½)=26.6°, and θ=(45°−α)=18.4°, where "α" is a rotational angle defined by an angle at which the bright region axis 13 is to the alignment axis 114. Moreover, in a case where a distance between the respective lattice points is defined as "A", A=2a/cos α. Therefore, X-shaped irradiation shapes, each of which is rotated by θ=18.4° with respect to the alignment axes 114 at the diffusion plate 112, are consecutively arranged. According to the arrangement, a dark region 54 of each four-leaf-shaped light emitting device 50 is combined with a corresponding bright region 52 of a corresponding one of adjacent four-leaf-shaped light emitting devices 50. This makes it possible to uniformize luminance at the diffusion plate 112. Note that a tolerance of the rotational angle θ appears to be approximately ±3°.

(d) of FIG. 4 illustrates, for comparison, irradiation shapes which are arranged so that the alignment axes 114 and the dark region axes 14 are in parallel with each other (i.e., θ=0°). According to the arrangement, the bright regions 52 which belong to respective four-leaf-shaped light emitting devices 50 partially overlap each other in diagonal directions of the four-leaf-shaped light emitting devices 50, so as to have respective increased luminances. On the other hand, the dark regions 54 which belong to respective four-leaf-shaped light emitting devices 50 overlap each other in breadthwise and lengthwise directions. Consequently, uniformity in luminance is deteriorated. This is because a difference between (i) a region with high luminance and (ii) a region with low luminance is promoted on a surface of the diffusion plate 112. It is therefore preferable to employ the arrangement shown in (c) of FIG. 4.

Moreover, an irradiation range of each light emitting device included in the four-leaf-shaped light emitting device 50 is larger than that of the dome-shaped light emitting device 60. This makes it possible to reduce the number of light emitting devices to be provided, in a case where a surface illuminant is made up of a plurality of four-leaf-shaped light emitting devices 50. Moreover, a light emission angle becomes large, that is, the light is emitted in a direction approaching a direction in which the base substrate 110 extends. It is therefore possible to reduce a distance between the base substrate 110 and the diffusion plate 112. This brings about an advantage of a reduction in thickness of a backlight.

Figure 5:
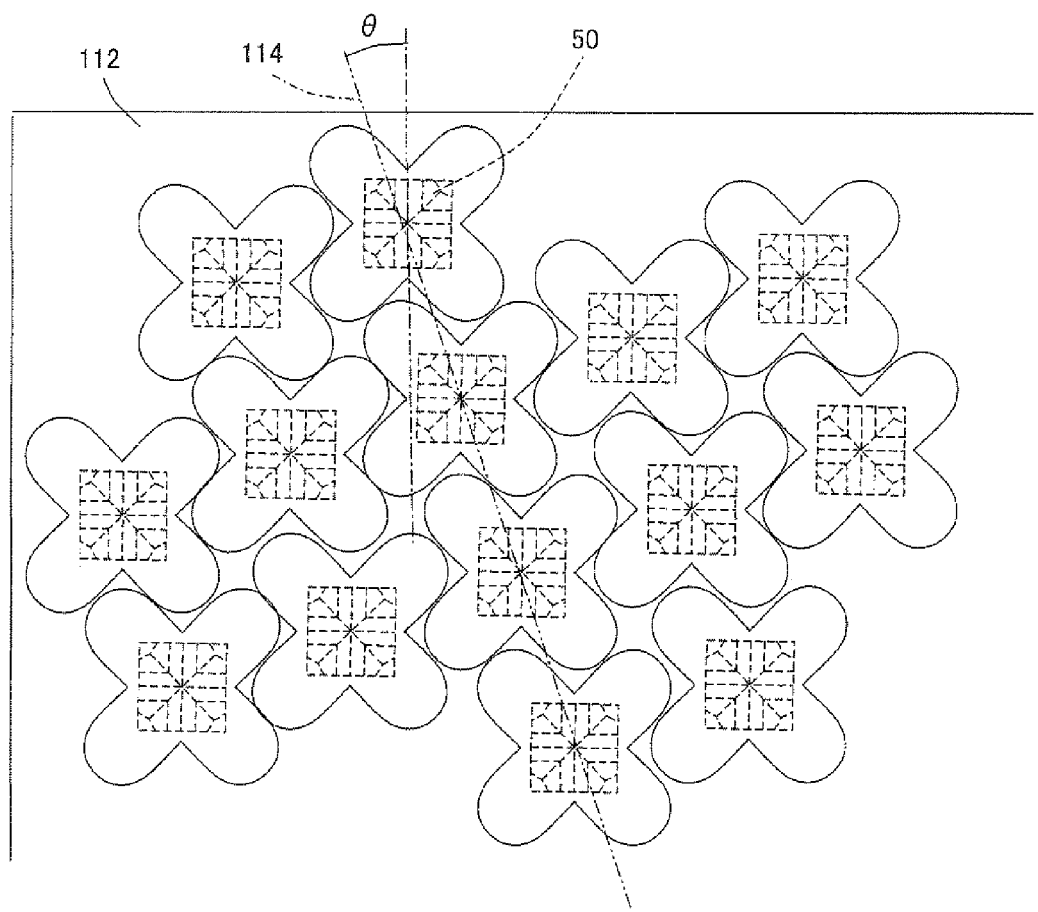
FIG. 5 is a view illustrating another aspect and irradiation shape of the surface illuminant in accordance with Embodiment 1.

FIG. 5 illustrates irradiation shapes in another configuration of the surface illuminant in accordance with Embodiment 1. According to an arrangement shown in FIG. 5, a plurality of four-leaf-shaped light emitting devices 50 are provided on the base substrate 110 in a staggered manner so that one side of each four-leaf-shaped light emitting device 50 is in parallel with one side of the base substrate 110. This is in contrast to the arrangement, shown in (c) of FIG. 4, in which the alignment axes 114 of the respective plurality of four-leaf-shaped light emitting devices 50 are in parallel with one side of (i) the base substrate 110 (not illustrated) and (ii) the diffusion plate 112. The arrangement shown in FIG. 5 is obtained by rotating the alignment axes 114 of the respective plurality of four-leaf-shaped light emitting devices 50 by an angle of θ(=18.4°) with respect to one side of the base substrate 110. That is, the arrangement shown in FIG. 5 has apparently a staggered arrangement, and is therefore substantially identical to that shown in (c) of FIG. 4.

Embodiment 2

Embodiment 1 is exemplified by the four-leaf-shaped light emitting device 50, whose irradiation shape is made up of four non-concentric bright regions and dark regions which are arranged so as to form a 4-fold rotational symmetry. The surface illuminant 100 is configured by providing the plurality of four-leaf-shaped light emitting devices 50 on the base substrate 110 so that uniformity in luminance of the surface illuminant 100 can be secured. However, the present invention is not limited to the configuration of Embodiment 1. For example, an LED chip, provided on a substrate 20, can (i) have a rectangular shape (a long LED chip) when viewed from above and (ii) have an irradiation shape which is a squeezed X-shape, a 2-fold rotational symmetry, and is made up of four non-concentric bright regions and four dark regions.

Figure 6:
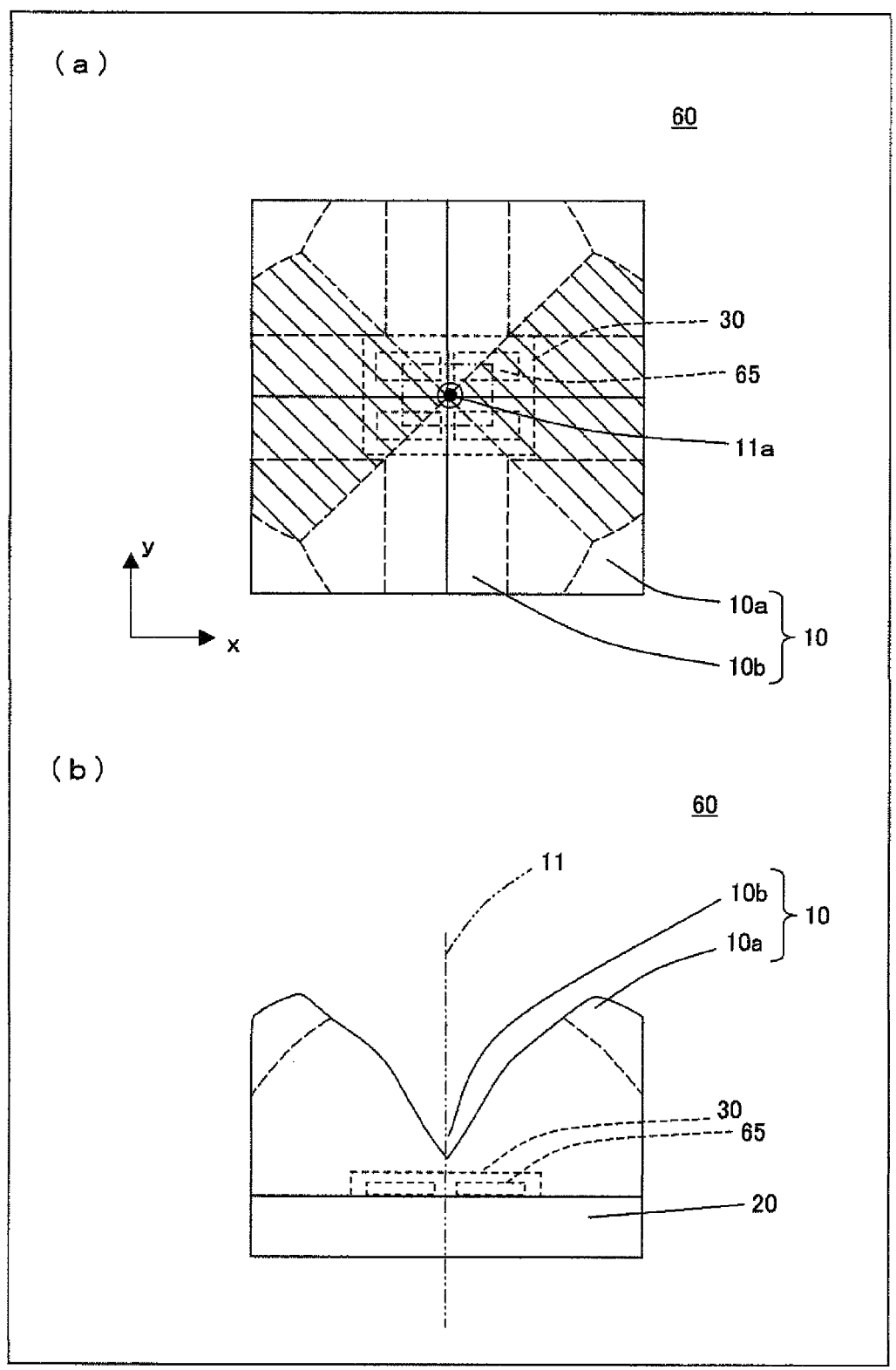
FIG. 6 is a plane view and a lateral view illustrating a four-leaf-shaped light emitting device of Embodiment 2.
Figure 7:
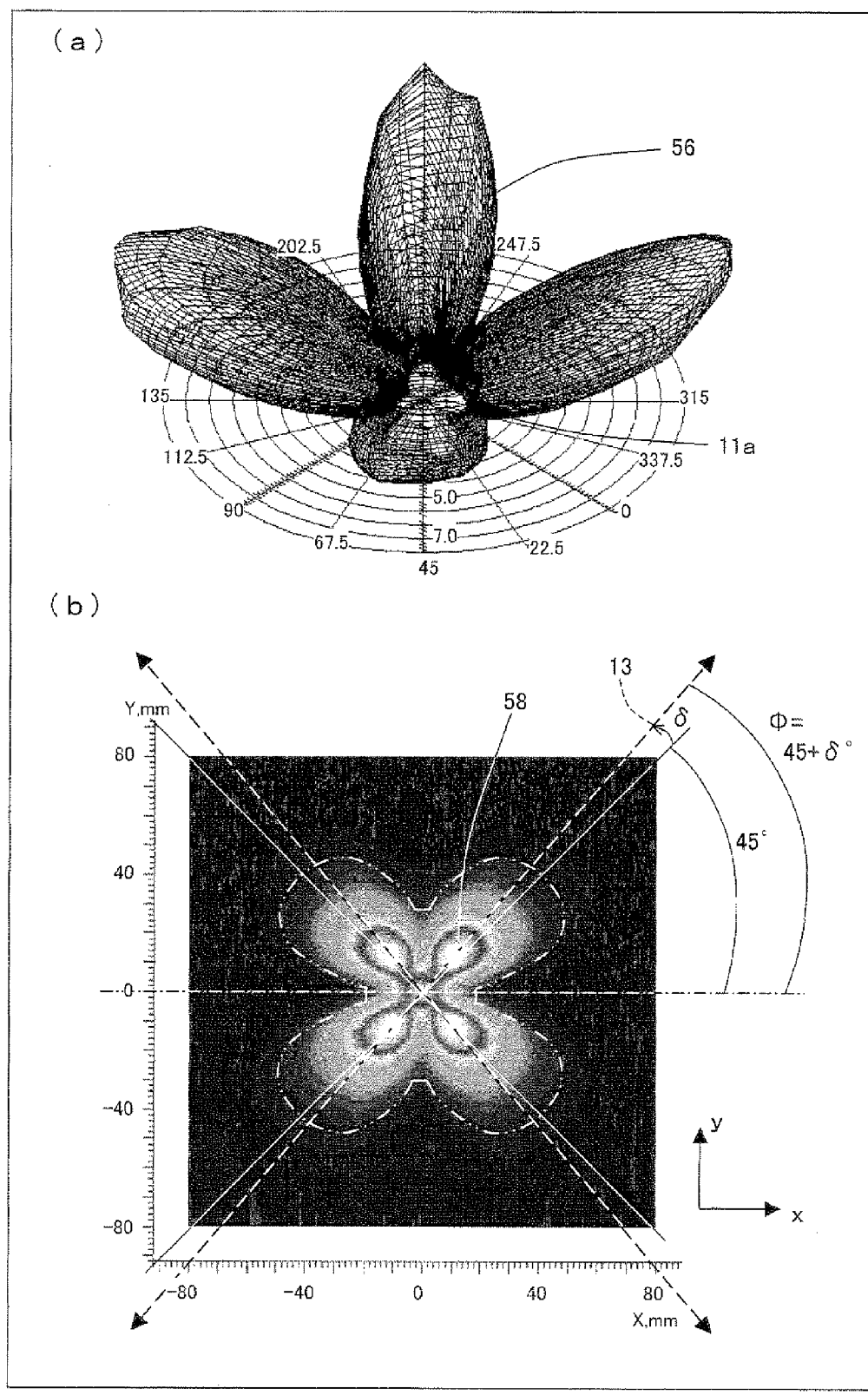
FIG. 7 is a view illustrating (i) a light distribution characteristic of and (ii) an irradiation shape of the four-leaf-shaped light emitting device in accordance with Embodiment 2.

FIG. 6 is a plane view and a lateral view showing a four-leaf-shaped light emitting device in accordance with Embodiment 2. FIG. 7 shows a light distribution characteristic and an irradiation shape of the four-leaf-shaped light emitting device in accordance with Embodiment 2. A four-leaf-shaped light emitting device 60 of Embodiment 2 is basically identical to the four-leaf-shaped light emitting device 50 of Embodiment 1, except that the four-leaf-shaped light emitting device 60 includes long LED chips 65.

Four long LED chips 65 are provided on a substrate 20 so that a longer side of each of the long LED chips 65 is in parallel with an x-direction (see (a) of FIG. 6). First light, which is emitted from the longer side, is mostly refracted or reflected by oblique surfaces (indicated by hatched region in (a) of FIG. 6) which extend in the x-direction of a lens 10 serving also as a sealing member, and thus mostly refracted or reflected first light exits out of the lens 10. On the other hand, second light, which is emitted from the shorter side, is mostly refracted or reflected by oblique surfaces which extend in the y-direction of the lens 10, and thus mostly refracted or reflected second light exits out of the lens 10. An amount of the first light is larger than that of the second light, and therefore an angle ø at which a bright region axis 13 is to an x-axis becomes large so that ø=(45°+δ°) (see (b) of FIG. 7). Consequently, the irradiation shape becomes a squeezed X shape, which is a 2-fold rotational symmetric shape.

The following describes a surface illuminant in which a plurality of four-leaf-shaped light emitting devices 60 of Embodiment 2 are provided. FIG. 8 shows (i) an irradiation shape of each of the plurality of four-leaf-shaped light emitting devices 60 and (ii) an arrangement pattern of the plurality of four-leaf-shaped light emitting devices included in the surface illuminant, in accordance with Embodiment 2. (a) of FIG. 8 is a plane view illustrating an irradiation shape of light emitted from each of the plurality of four-leaf-shaped light emitting devices 60 of Embodiment 2. The following description is dealt with, on the premise that (i) the irradiation shape of light emitted from each of the plurality of four-leaf-shaped light emitting devices 60 in Embodiment 2 has an X-shape in which five identical rhombuses (indicated by dashed-two dotted lines in (a) of FIG. 8) are arranged, (ii) each of bright regions 62 has a shape so as to be contained in a corresponding one of rhombuses, and (iii) the rhombuses have substantially identical luminances.

(b) of FIG. 8 is a plane view illustrating (i) an arrangement of the plurality of four-leaf-shaped light emitting devices 60 and (ii) irradiation shapes of the respective plurality of four-leaf-shaped light emitting devices 60 serving as a surface illuminant. As is clear from the configuration shown in (b) of FIG. 8, the plurality of four-leaf-shaped light emitting devices 60, each of which emits light whose irradiation shape is shown in (a) of FIG. 8, are provided on the base substrate 110 in a parallelogram manner. Specifically, assuming that lattice points of alignment axes 114 serve as apexes of parallelograms, the plurality of four-leaf-shaped light emitting devices 60 are (i) provided so as to be located on the respective lattice points (see dashed-two dotted lines in (b) of FIG. 8), and (ii) rotated with respect to the alignment axes 114.

According to the arrangement, a dark region 64 of each four-leaf-shaped light emitting devices 60 is combined with a corresponding bright region 62 of a corresponding one of adjacent four-leaf-shaped light emitting devices 60, as with Embodiment 1. This makes it possible to uniformize luminance at the diffusion plate 112.

Embodiment 3

A surface illuminant of Embodiment 3 includes light emitting devices which have a 3-fold rotational symmetric luminance distribution made up of irradiation shapes of three non-concentric bright regions and three dark regions. Alternatively, a surface illuminant of Embodiment 3 includes light emitting devices which have a 6-fold rotational symmetric luminance distribution made up of six non-concentric bright regions and six dark regions. Each of FIGS. 9 and 10 illustrates an irradiation shape of and an arrangement pattern of the surface illuminant in accordance with Embodiment 3.

The present embodiment can be exemplified by a light emitting device 70 which has an irradiation shape is a 3-fold rotational symmetric shape made up of non-concentric three bright regions and three dark regions. The light emitting device 70 includes (i) three long chips 65 (indicated by dashed lines in (a) of FIG. 9) provided at respective apexes of an imaginary equilateral triangle (not illustrated) on a substrate and (ii) a lens 10 (indicated by dashed lines in (a) of FIG. 9), which serves also as a sealing member and has a hexagonal pyramid shape provided so as to cover the three long chips 65.

Alternatively, the present embodiment can be exemplified by a light emitting device 80 which has an irradiation shape is a 6-fold rotational symmetric shape made up of non-concentric six bright regions and six dark regions. The light emitting device 80 includes (i) six long chips 65 (indicated by dashed lines in (a) of FIG. 10) provided at respective apexes of an imaginary equilateral hexagon (not illustrated) on a substrate and (ii) a lens 10 (indicated by dashed lines in (a) of FIG. 10), which serves also as a sealing member and has a hexagonal truncated pyramid shape provided so as to cover the six long chips 65.

As is clear from (a) of FIG. 9, the light emitting device 70 has an irradiation shape which is made up of bright regions 72, each of which (i) has an equal luminance and (ii) can be assumed to be a hexagonal shape. The hexagons (i) are arranged in a close-packed manner so that any adjacent two of the hexagons share one side and (ii) define an irradiation area unit 76 (indicated by the hatching in (b) of FIG. 9) having a 3-fold rotational symmetric shape. In the vicinity of the bright regions 72, dark regions 74 occur so as to correspond which are darker than the bright regions 72.

Similarly, as is clear from (a) of FIG. 10, the light emitting device 80 has an irradiation shape which is made up of six bright regions 82, each of which (i) has an equal luminance and (ii) can be assumed to be a hexagonal shape. The six hexagons are arranged in a close-packed manner so that one sides of the respective six hexagons define another hexagon provided in the center of the six hexagons. The six hexagons and the another hexagon define an irradiation area unit 86 (indicated by the hatching in (b) of FIG. 10) having a 6-fold rotational symmetric shape.

On the base substrate 110 (not illustrated), (i) the light emitting devices 70 each of which has the irradiation shape shown in (a) of FIG. 9 or (ii) the light emitting devices 80 each of which has the irradiation shape shown in (a) of FIG. 10 are provided at respective lattice points at which alignment axes 114 intersect one another and which constitute apexes of triangles (see dashed-two dotted lines in (b) of FIG. 9 or (b) of FIG. 10). That is, the light emitting devices 70 or 80 are provide in a close-packed manner so as to be provided at respective lattice points.

According to the present embodiment, light emitting devices, each of which has an n-fold rotational symmetric irradiation shape ("n" is an integer of 2 or more), are provided so that each dark region of one of the light emitting devices is irradiated with a corresponding bright region of another of the light emitting devices. This makes it possible to provide a surface illuminant which can uniformize luminance, as with Embodiment 1. Moreover, as is clear from the drawings, "n", the rotational angle θ, and the rotational angle α meet one of the following inequalities: $0° \le \theta \le 360°/n$ and $0° \le \alpha \le 360°/n$.

Embodiment 4

FIG. 11 is a schematic view illustrating a local dimming liquid crystal display device. (a) of FIG. 11 shows a plane view of and a lateral view of a local dimming display device. A local dimming display device 500 includes (i) a liquid crystal display panel (hereinafter, referred to as display panel) 510 and (ii) a surface illuminant 100 that is described in Embodiment 1 and serves as a backlight which backlights the display panel 510. The display panel 510 is made up of a first plurality of areas, and the surface illuminant 100 is also made up of a second plurality of areas which are provided for the respective first plurality of areas and can be driven independently. The surface illuminant 100 is driven by a driver (not illustrated) which is capable of adjusting luminance based on an image displayed on the display panel 510. Specifically, the surface illuminant 100 is driven by the driver so as to selectively irradiate, with intense light from behind, a high luminance area in an image displayed on the display panel 510. On the other hand, the surface illuminant 100 is driven by the driver so as to selectively irradiate, with weak light from behind, a low luminance area in an image displayed on the display panel 510. This makes it possible to (i) suppress power consumption and (ii) improve contrast.

(b) of FIG. 11 illustrates positional relation between (i) the first areas constituting the display panel 510 and (ii) the respective second areas constituting the surface illuminant 100. In a case where, for example, an image of an exit 512 of a tunnel, which exit 512 is seen in a traveling direction and photographed from a vehicle moving in the tunnel, is displayed on the display panel 510, the exit 512 is brightly displayed in the dark. It is assumed that (i) a segment 510a is an area of the display panel 510 on which area the exit 512 is displayed and (ii) a segment 100a is an area of the surface illuminant 100 which area is right behind the segment 510a. In a case where the image of the exit 512 is displayed, the luminance of a segment 100a, which is right behind the segment 510a, should be increased.

According to Embodiment 4, the irradiation shape of each of the four-leaf-shaped light emitting devices 50, provided on the base substrate 110, is an X-shape. That is, each of the four-leaf-shaped light emitting device 50 irradiates a limited area with light, and therefore light is hardly spread toward other areas. This makes it possible to suppress occurrence of a crosstalk in which light is leaked into an adjacent segment. Therefore, the surface illuminant including the four-leaf-shaped light emitting devices 50 can be suitably used as a backlight of a local dimming display device. Note that the surface illuminant is not limited to that described in Embodiment 1, and can be therefore a surface illuminant described in Embodiment 2 or 3. Moreover, the display device is not limited to a liquid crystal display device, and can be therefore a display device which generally changes optical transmittance from area to area.

Summary of Embodiments

A light emitting device of the present invention includes: a substrate; a semiconductor light emitting element provided on the substrate; a sealing member which is provided so as to cover the semiconductor light emitting element; and a lens made up of a plurality of convex parts and a concave part, the light emitting device emitting light having a non-concentric luminance distribution made up of a plurality of bright regions and a plurality of dark regions, the non-concentric luminance distribution being observed on a plane which is parallel to the substrate.

According to the light emitting device of the present invention, it is preferable that: the number of the plurality of bright regions is 3, 4, or 6; and the number of the plurality of dark regions is 3, 4, or 6.

According to the light emitting device of the present invention, it is preferable that the non-concentric luminance distribution has an n-fold rotational symmetric shape, where said n is an integer of 2 or more.

According to the light emitting device of the present invention, it is preferable that: the semiconductor light emitting element includes a plurality of semiconductor light emitting elements; and the lens covers the plurality of semiconductor light emitting elements, the lens having (i) convex parts which are provided for the respective plurality of semiconductor light emitting elements and (ii) a concave part which is provided above an area between respective any adjacent two of the plurality of semiconductor light emitting elements.

According to the light emitting device of the present invention, it is preferable that the sealing member serves also as the lens.

According to the light emitting device of the present invention, it is preferable that: a wavelength converter is provided in the sealing member, the wavelength converter (i) absorbing primary light emitted from the semiconductor light emitting element and then (ii) emitting secondary light.

A surface illuminant of the present invention includes: a base substrate; and the plurality of light emitting devices, the plurality of light emitting devices being provided on the base substrate, the plurality of light emitting devices being adjacently arranged so that (i) a dark region caused by one of the plurality of light emitting devices and (ii) a bright region caused by another of the plurality of light emitting devices are combined with each other.

According to the surface illuminant of the present invention, it is preferable that: each of the plurality of light emitting devices has n-bright regions; and a rotational angle θ at which a dark region axis is to an alignment axis meeting 0°≤θ360°/n, the dark region axis being a line connecting the dark regions with respective centers of light emitting devices, and the alignment axis being a line connecting the centers of the light emitting devices.

According to the surface illuminant of the present invention, it is preferable that: the n is 4; and the rotational angle θ is 18.4°±3°.

A display device of the present invention includes: the surface illuminant; and a display panel which changes optical transmittance from pixel area to pixel area, the surface illuminant backlighting the display panel.

A display device of the present invention, includes: the surface illuminant, the surface illuminant being made up of a plurality of areas which are driven independently; and a display panel which changes optical transmittance from pixel area to pixel area, the surface illuminant backlighting the display panel.

The present invention is not limited to the embodiments, but can be altered by a skilled person in the art within the scope of the claims. An embodiment derived from a proper combination of technical means disclosed in respective different embodiments is also encompassed in the technical scope of the present invention.

REFERENCE SIGNS LIST

10: Lens which serves also as a sealing member
10a: Convex part
10b: Concave part
50 and 60: Four-leaf-shaped light emitting device
70 and 80: Light emitting device
52, 62, 72, and 82: Bright region
54, 64, 74, and 84: Dark region
100, 200, 300, and 400: Surface illuminant
112: Diffusion plate
500: Display device

The invention claimed is:
1. A light emitting device comprising:
a substrate;
one or more semiconductor light emitting elements provided on the substrate;
a sealing member which is provided so as to cover the one or more semiconductor light emitting elements; and
a lens made up of a plurality of convex parts and a concave part, wherein
the plurality of convex parts are arranged so as to form an n-fold rotational symmetric shape, and the concave part is arranged so as to form an n-fold rotational symmetric shape where n is an integer of 2 or more,
said light emitting device emitting light having a non-concentric luminance distribution made up of a plurality of bright regions and a plurality of dark regions, the non-concentric luminance distribution being observed on a plane which is parallel to the substrate, wherein
at least one of the plurality of convex parts extends along a diagonal line seen from a plane view,
the plurality of convex parts protrude away from the substrate in a direction parallel to a rotational symmetric axis of the light emitting device,
the light emitting device is arranged alongside a second light emitting device comprising one or more semiconductor light emitting elements, so that a bright region created by the second light emitting device overlaps with a dark region created by the light emitting device, and
when the light emitting device comprises a plurality of semiconductor light emitting elements, the plurality of semiconductor light emitting elements are positioned to form an n-sided polygon, and, each one of the plurality of semiconductor light emitting elements is completely contained inside each one of the plurality of convex parts.

2. The light emitting device as set forth in claim 1, wherein:
the number of the plurality of bright regions is 3, 4, or 6; and
the number of the plurality of dark regions is 3, 4, or 6.

3. The light emitting device as set forth in claim 1, wherein the non-concentric luminance distribution has an n-fold rotational symmetric shape, where n is an integer of 2 or more.

4. The light emitting device as set forth in claim 1, wherein:
the semiconductor light emitting element includes a plurality of semiconductor light emitting elements; and
the lens covers the plurality of semiconductor light emitting elements,
the lens having (i) convex parts which are provided for the respective plurality of semiconductor light emitting elements and (ii) a concave part which is provided above an area between respective any adjacent two of the plurality of semiconductor light emitting elements.

5. The light emitting device as set forth in claim 1, wherein the sealing member serves also as the lens.

6. The light emitting device as set forth in claim 1, wherein:
a wavelength converter is provided in the sealing member, the wavelength converter (i) absorbing primary light emitted from the semiconductor light emitting element and then (ii) emitting secondary light.

7. A surface illuminant, comprising:
a base substrate; and
a plurality of light emitting devices each recited in claim 1, the plurality of light emitting devices being provided on the base substrate,
the plurality of light emitting devices being adjacently arranged so that (i) a dark region caused by one of the plurality of light emitting devices and (ii) a bright region caused by another of the plurality of light emitting devices are combined with each other.

8. The surface illuminant as set forth in claim 7, wherein:
each of the plurality of light emitting devices has n-bright regions; and
a rotational angle $\theta$ at which a dark region axis is to an alignment axis meeting $0°\leq\theta\leq360°/n$,
the dark region axis being a line connecting the dark regions with respective centers of light emitting devices, and the alignment axis being a line connecting the centers of the light emitting devices.

9. The surface illuminant as set forth in claim 8, wherein:
said n is 4; and
the rotational angle $\theta$ is $18.4°\pm3°$.

10. A display device, comprising:
a surface illuminant recited in claim 7; and
a display panel which changes optical transmittance from pixel area to pixel area,
the surface illuminant backlighting the display panel.

11. A display device, comprising:
a surface illuminant recited in claim 7, the surface illuminant being made up of a plurality of areas which are driven independently; and
a display panel which changes optical transmittance from pixel area to pixel area,
the surface illuminant backlighting the display panel.

* * * * *